US010923314B2

United States Patent
Nakamura

(10) Patent No.: US 10,923,314 B2
(45) Date of Patent: Feb. 16, 2021

(54) METHOD OF IMAGE ACQUISITION AND ELECTRON MICROSCOPE

(71) Applicant: JEOL Ltd., Tokyo (JP)

(72) Inventor: Akiho Nakamura, Tokyo (JP)

(73) Assignee: JEOL Ltd., Tokyo (JP)

( * ) Notice: Subject to any disclaimer, the term of this patent is extended or adjusted under 35 U.S.C. 154(b) by 184 days.

(21) Appl. No.: 15/830,304

(22) Filed: Dec. 4, 2017

(65) Prior Publication Data

US 2018/0158646 A1 Jun. 7, 2018

(30) Foreign Application Priority Data

Dec. 5, 2016 (JP) ................................. 2016-235674

(51) Int. Cl.
*H01J 37/22* (2006.01)
*H01J 37/28* (2006.01)
(Continued)

(52) U.S. Cl.
CPC .............. *H01J 37/222* (2013.01); *G01N 9/24* (2013.01); *G01N 23/041* (2018.02); *H01J 37/147* (2013.01); *H01J 37/20* (2013.01); *H01J 37/244* (2013.01); *H01J 37/28* (2013.01); *H01J 2237/20207* (2013.01); *H01J 2237/221* (2013.01); *H01J 2237/24578* (2013.01); *H01J 2237/2614* (2013.01); *H01J 2237/2617* (2013.01); *H01J 2237/2802* (2013.01);
(Continued)

(58) Field of Classification Search
CPC .......... H01J 37/222; H01J 37/28; H01J 37/20; H01J 37/147; H01J 37/244; H01J 2237/2809; H01J 2237/221; H01J 2237/2614; H01J 2237/24578; H01J 2237/20207; H01J 2237/2802; H01J 2237/2804; H01J 2237/2617; H01J 2237/2803; G01N 9/24; G01N 23/041
USPC ........................................................ 250/311
See application file for complete search history.

(56) References Cited

U.S. PATENT DOCUMENTS 5,576,543 A 11/1996 Dingley
6,570,156 B1 * 5/2003 Tsuneta .................. H01J 37/26
250/311
(Continued)

FOREIGN PATENT DOCUMENTS

GB 2019085 A 10/1979
JP 193041 A 4/1989

OTHER PUBLICATIONS

A.C. Daykin, et al., "Magnetization imaging at high spatial resolution using transmission electron microscopy", Journal of Applied Physics, vol. 80, No. 6, Sep. 15, 1996, pp. 3408-3411.
(Continued)

*Primary Examiner* — Kiet T Nguyen
(74) *Attorney, Agent, or Firm* — The Webb Law Firm

(57) ABSTRACT

There is provided a method of image acquisition capable of reducing the effects of diffraction contrast. This method of image acquisition is implemented in an electron microscope for generating electron microscope images with electrons transmitted through a sample. The method starts with obtaining the plural electron microscope images while causing relative variations in the direction of incidence of an electron beam with respect to the sample. An image is generated by accumulating the plural electron microscope images.

11 Claims, 17 Drawing Sheets

(51) Int. Cl.
*H01J 37/20* (2006.01)
*H01J 37/147* (2006.01)
*H01J 37/244* (2006.01)
*G01N 23/041* (2018.01)
*G01N 9/24* (2006.01)

(52) U.S. Cl.
CPC ............ *H01J 2237/2803* (2013.01); *H01J 2237/2804* (2013.01); *H01J 2237/2809* (2013.01)

(56) References Cited

U.S. PATENT DOCUMENTS

| | | | | |
|---|---|---|---|---|
| 2007/0158567 | A1* | 7/2007 | Nakamura | H01J 37/28 250/311 |
| 2008/0224040 | A1* | 9/2008 | Nagaoki | H01J 37/222 250/311 |
| 2012/0199739 | A1* | 8/2012 | Nakano | H01J 37/153 250/307 |
| 2014/0070095 | A1 | 3/2014 | Schoenmakers et al. | |
| 2018/0337019 | A1* | 11/2018 | Sagawa | G01N 23/20058 |

OTHER PUBLICATIONS

J.N. Chapman, "High Resolution Imaging of Magnetic Structures in the Transmission Electron Microscope", Materials Science and Engineering, B3, Elsevier, Amsterdam, NL, vol. 3, Jan. 1, 1989, pp. 355-358.

J.N. Chapman, et al., Determination of Domain Wall Structures in Thin Foils of a Soft Magnetic Alloy, Journal of Magnetism and Magnetic Materials, Elsevier, Amsterdam, NL, vol. 49, No. 3, Apr. 1, 1985, pp. 277-285.

D.J. Taplin, et al., "Low magnification differential phase contrast imaging of electric fields in crystals with fine electron probes", Ultramicroscopy, Elsevier B.V. NL, vol. 169, Oct. 2016, pp. 69-79.

Extended European Search Report re: EP 17205387.8, dated Aug. 26, 2019.

* cited by examiner

METHOD OF IMAGE ACQUISITION AND ELECTRON MICROSCOPE

CROSS-REFERENCE TO RELATED APPLICATION

This application claims priority to Japanese Patent Application No. 2016-235674 filed Dec. 5, 2016, the disclosure of which is hereby incorporated in its entirety by reference.

BACKGROUND OF THE INVENTION

1. Field of the Invention

The present invention relates to a method of image acquisition and electron microscope.

2. Description of the Related Art

Electron microscopes such as transmission electron microscopes (TEMs) and scanning transmission electron microscopes (STEMs) can generate electron microscope images such as TEM images and STEM images by detecting an electron beam transmitted through a sample.

Where a crystalline sample is observed with a transmission electron microscope or a scanning transmission electron microscope, there occurs diffraction contrast according to variations in the thickness or tilt of the sample, in addition to contrast attributed to the atomic structure of the sample or defects present in it. Contrast attributed to nonuniformity of the sample thickness is referred to as thickness contours or (interference) fringes of equal thickness. Contrast arising from inclination of the sample is referred to as bend contours or (interference) fringes of equal inclination. These diffraction contrast phenomena appear especially conspicuously when observations are made at moderate and low magnifications (e.g., less than 100,000×).

In recent years, differential phase contrast (DPC) has attracted attention as a technique of scanning transmission electron microscopy. In the DPC method, the deflection of an electron beam due to the electromagnetic field within a sample is measured at each point of impingement of the beam, and the electromagnetic field within the sample is visualized and imaged. In the differential phase contrast method, the electron beam transmitted through a sample is deflected by the electromagnetic field within the sample, and this deflection is detected as a beam shift on the detection surface of a detector. Therefore, a segmented detector whose detection surface is split into plural detection elements is employed as a detector for detecting an electron beam transmitted through a sample. The use of the segmented detector makes it possible to calculate the direction and magnitude of the shift of the electron beam on the detection surface. The sense and magnitude of the electromagnetic field within the sample can be found from the direction and magnitude of the shift of the electron beam.

CITATION LIST

Patent Documents

Patent document 1: JP-A-1-93041

Where an observation is made with an electron microscope under an imaging mode that does not depend on diffraction contrast as typified by observations using a differential phase contrast method at moderate and low magnifications, diffraction contrast phenomena such as fringes of equal thickness and fringes of equal inclination greatly obstruct the observation. Consequently, the user must search on a trial-and-error basis for sample tilting conditions under which such diffraction contrast phenomena are lessened.

FIG. 19 is an azimuthal map of vector showing the results of observations of a PN junction in GaAs by a differential phase contrast method. In FIG. 19, the senses of field components are represented in colors. The magnitudes of the field components are represented by gray scale levels.

The map of FIG. 19 is observed to have fringes of equal thickness attributed to nonuniformity of the sample thickness and fringes of equal inclination arising from tilt of the sample, as well as contrast due to the PN junction to be observed. These diffraction contrast phenomena are observed as belt-like fringes in FIG. 19. The map of FIG. 19 has been obtained by searching for those sample tilting conditions which minimize the effects of these diffraction contrast phenomena in a trial and error manner. Yet, the effects of these diffraction contrast phenomena have not been completely eliminated.

When an electron beam impinges on a crystalline sample, if the direction of incidence is close to low-order crystal zone axes, numerous diffraction waves are excited and so strong and complex diffraction contrast is observed. Therefore, it is substantially impossible to make observations relying on a high-sensitivity differential phase contrast method from a crystallographic orientation along the low-order crystal zone axes except for atomic-resolution (high-resolution) observations. In order to reduce the effects of diffraction contrast, observations are urged to be made from an orientation greatly deviating from low-order crystal zone axes. The map of FIG. 19 has been derived by tilting the direction of incidence of the electron beam by more than 10 degrees from the low-order crystal zone axes.

Also, when a polycrystalline sample such as a sintered object is observed using a differential phase contrast method, the observation is affected by diffraction contrast but the individual crystallites of a polycrystal are generally not uniform in orientation. Accordingly, optimum sample tilting conditions are different for each different crystallite. Thus, it is often impossible to search for sample tilting conditions under which the effects of diffraction contrast are reduced for plural crystallites at the same time. Hence, an operation consisting of searching for optimum sample tilting conditions for one crystallite and making an observation must be done for each crystallite. Many single crystallites are small in size. An operation for aligning the crystallographic orientation of one crystallite is itself difficult to perform. In this way, it is quite difficult to perform, for each crystallite, the operation consisting of searching for optimum sample tilting conditions and making an observation.

In the foregoing description, observations using a differential phase contrast method are taken as one example. TEM and STEM techniques which are affected by diffraction contrast phenomena such as fringes of equal thickness and fringes of equal inclination when bright-field images are generated and observed at moderate and low magnifications also suffer from similar problems.

SUMMARY OF THE INVENTION

The present invention has been made in view of the foregoing problem. One object associated with some aspects of the present invention is to provide a method of image acquisition capable of reducing the effects of diffraction contrast. Another object associated with some aspects of the invention is to provide an electron microscope capable of acquiring images less affected by diffraction contrast.

(1) A method of image acquisition associated with the present invention is implemented in an electron microscope for generating electron microscope images with electrons transmitted through a sample. The method involves the steps of: obtaining the plural electron microscope images while causing relative variations in the direction of incidence of an electron beam with respect to the sample; and generating an image by accumulating the plural electron microscope images.

This method of image acquisition can acquire electron microscope images less affected by diffraction contrast such as fringes of equal thickness and fringes of equal inclination.

(2) In one feature of the method of image acquisition of (1) above, during the step of obtaining the plural electron microscope images, the causing of the relative variations in the direction of incidence of the electron beam with respect to the sample may be carried out by tilting the sample relative to the direction of incidence of the electron beam.

(3) In another feature of the method of image acquisition of (1) above, during the step of obtaining the plural electron microscope images, the causing of the relative variations in the direction of incidence of the electron beam with respect to the sample may be carried out by deflecting the electron beam incident on the sample so as to vary the direction of incidence of the electron beam with respect to the sample.

(4) In one feature of the method of image acquisition of any one of (1)-(3) above, the electron microscope images may be scanning transmission electron microscope images.

(5) In another feature of the method of image acquisition of any one of (1)-(3) above, the electron microscope images may be transmission electron microscope images.

(6) In a further feature of the method of image acquisition of any one of (1)-(3) above, each of the electron microscope images may be a differential phase contrast image obtained by scanning the electron beam over the sample and measuring the amount of deflection of the electron beam caused by an electromagnetic field in the sample for each position of impingement of the electron beam.

This method of image acquisition can reduce the effects of diffraction contrast without reducing contrast produced by the differential phase contrast method.

(7) Another method of image acquisition associated with the present invention is implemented in an electron microscope for generating scanning transmission electron microscope images by scanning an electron beam over a sample and obtaining intensity information about the electron beam transmitted through the sample for each position of impingement of the electron beam. The method involves the steps of: obtaining the intensity information about the electron beam transmitted through the sample for each position of impingement by scanning the electron beam over the sample while varying the direction of incidence of the electron beam relative to the sample at each position of impingement; and generating an image on the basis of the intensity information about the electron beam for each position of impingement.

In this method of image acquisition, electron microscope images less affected by diffraction contrast such as fringes of equal thickness and fringes of equal inclination can be obtained.

(8) An electron microscope associated with the present invention has an electron source for emitting an electron beam, an incident direction control section for causing relative variations in the direction of incidence of the electron beam with respect to a sample, a detector for detecting the electron beam transmitted through the sample, and an image generator for generating an image on the basis of the result of detection made by the detector. The image generator operates to obtain plural electron microscope images derived by causing relative variations in the direction of incidence of the electron beam with respect to the sample by the use of the incidence direction control section and to accumulate the plural electron microscope images, thus generating an image.

This electron microscope can produce electron microscope images which are less affected by diffraction contrast such as fringes of equal thickness and fringes of equal inclination.

(9) Another electron microscope associated with the present invention has an electron source for emitting an electron beam, a scanning deflector for causing the electron beam emitted from the electron source to be scanned over a sample, an incident direction control section for causing variations in the direction of incidence of the electron beam with respect to the sample, a detector for detecting the electron beam transmitted through the sample, and an image generator for generating an image on the basis of the result of detection made by the detector. The image generator operates to obtain intensity information about the electron beam transmitted through the sample for each position of impingement, the intensity information being derived by scanning the electron beam over the sample by the scanning deflector while causing variations in the direction of incidence of the electron beam with respect to the sample at each position of impingement by the incident direction control section, and to generate an image on the basis of the intensity information about the electron beam for each position of impingement.

This electron microscope can produce electron microscope images which are less affected by diffraction contrast such as fringes of equal thickness and fringes of equal inclination.

(10) In one feature of the electron microscope as set forth in (8) or (9) above, the incident direction control section may be a deflector that deflects the electron beam impinging on the sample.

(11) In another feature of the electron microscope as set forth in (8) or (9) above, the incident direction control section may be a sample stage equipped with a tilt mechanism for tilting the sample.

DETAILED DESCRIPTION OF THE INVENTION

The preferred embodiments of the present invention are hereinafter described in detail with reference to the drawings. It is not intended that the embodiments provided below unduly restrict the scope and content of the present invention delineated by the appended claims. Also, it is to be understood that not all the configurations described below are essential constituent components of the invention.

1. First Embodiment

1.1. Configuration of Electron Microscope

Figure 1:
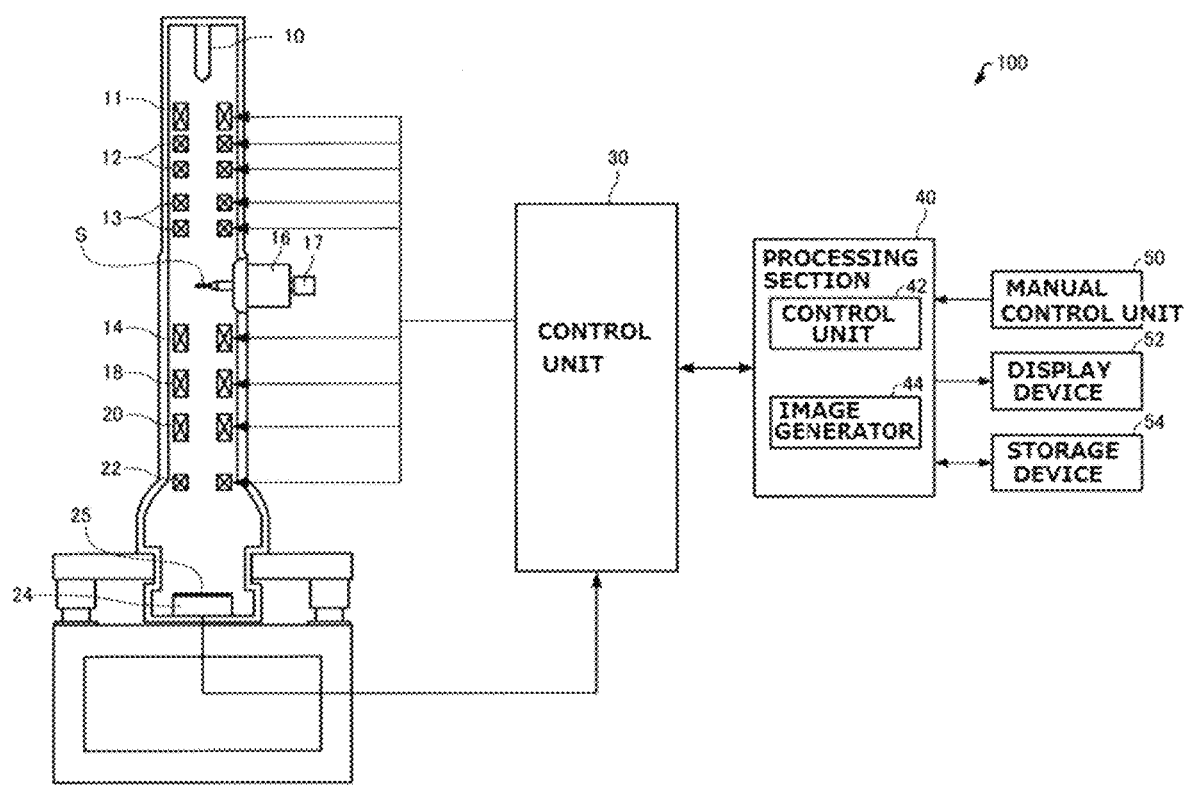
FIG. 1 is a schematic diagram, partly in cross section, of an electron microscope associated with a first embodiment of the present invention.

FIG. 1 schematically shows an electron microscope, 100, associated with a first embodiment of the present invention. The electron microscope 100 is a scanning transmission electron microscope (STEM). That is, the electron microscope 100 is an instrument for generating a scanning transmission electron microscope (STEM) image by scanning an electron probe (focused electron beam) over a sample S and obtaining intensity information about the electron beam transmitted through the sample S for each position of impingement of the beam.

As also shown in FIG. 1, the electron microscope 100 includes an electron source 10, an illumination lens system 11, an illumination deflector system 12, scan coils 13 (one example of scanning deflector), an objective lens 14, a sample stage 16 (one example of incident direction control section), a sample holder 17, an intermediate lens 18, a projector lens 20, an imaging deflector 22, a segmented detector 24 (one example of detector), a control unit 30, a processing section 40, a manual control unit 50, a display device 52, and a storage device 54.

The electron source 10 emits an electron beam. For example, the electron source 10 is an electron gun which emits the electron beam by accelerating electrons, released from a cathode, by means of an anode.

The illumination lens system 11 focuses the electron beam released from the electron source 10. The illumination lens system 11 may be composed of a plurality of electron lenses (not shown) such as a condenser lens and a condenser minilens. The condenser lens is used to focus the electron beam released from the electron source 10. The condenser minilens is disposed between the condenser lens and the objective lens 14. The condenser minilens is used to generate an electron beam having an angle of convergence adapted for the observation mode.

The electron beam emitted from the electron source 10 is deflected in two dimensions by the illumination deflector system 12. The deflector system 12 can shift and tilt the electron beam over the sample S. For example, the illumination deflector system 12 is composed of two stages of deflection coils. The first stage of deflection coil can deflect the electron beam. The second stage of deflection coil can swing the deflected beam back to its original path. The direction of incidence of the electron beam with respect to the sample S can be varied by deflecting the electron beam through the use of the illumination deflector system 12.

The electron beam emitted from the electron source 10 is deflected in two dimensions by the scan coils 13. The scan coils 13 are used such that the electron beam (electron probe) focused by the illumination lens system 11 is scanned over the sample S. That is, the scan coils 13 are employed to scan the position of impingement of the beam on the sample S.

The objective lens 14 is used to form the electron probe by focusing the electron beam onto the sample S. Furthermore, the objective lens 14 acts to image the electron beam transmitted through the sample S. An objective minilens (not shown) may be disposed in a stage following the objective lens 14. The objective minilens has no polepieces for strengthening the magnetic field unlike the objective lens 14.

The illumination system of the electron microscope 100 incorporates a condenser aperture (not shown) for controlling the angular aperture and dose of the electron beam. The illumination system of the electron microscope 100 is an optical system for directing the electron beam at the sample S. The imaging system (described later) of the electron microscope 100 is an optical system for imaging the electron beam transmitted through the sample S.

The sample stage 16 holds the sample S. In the illustrated example, the sample stage 16 holds the sample S via the sample holder 17. The sample stage 16 can move the sample S horizontally and vertically. Furthermore, the sample stage 16 has a tilt mechanism and can tilt or rotate the sample S about two axes perpendicular to each other. The intermediate lens 18 and projector lens 20 transfer the electron beam transmitted through the sample S to the segmented detector 24.

The electron beam transmitted through the sample S is deflected in two dimensions by the imaging deflector 22. The imaging deflector 22 is located in front of (on the upstream side as viewed along the direction of the flow of the electron beam) the segmented detector 24. The electron beam can be made to impinge at a desired position on the detection surface 25 of the segmented detector 24 by deflecting the beam by means of the imaging deflector 22.

The segmented detector 24 is mounted behind (on the downstream side as viewed along the direction of the flow of the electron beam) the projector lens 20. The segmented detector 24 has the detection surface 25 for detecting the electron beam transmitted through the sample S, the detection surface 25 being split into multiple detection elements.

Figure 2:
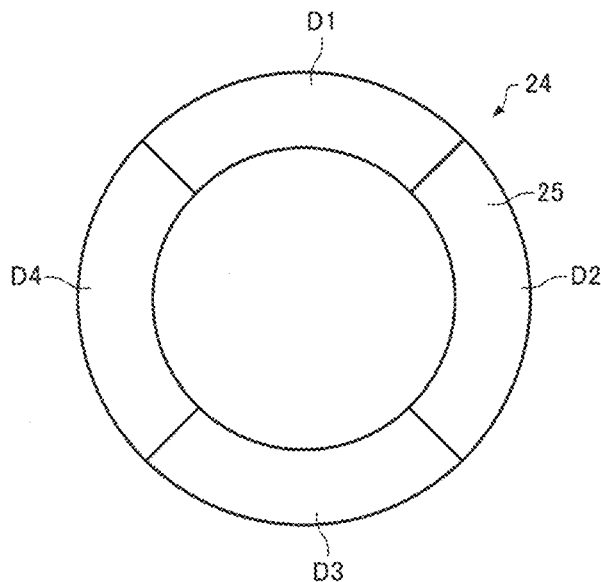
FIG. 2 is a schematic view of the detection surface of a segmented detector.

FIG. 2 schematically illustrates the detection surface 25 of the segmented detector 24. As shown in FIG. 2, the detection surface 25 of the segmented detector 24 is divided into plural or multiple detection elements D1, D2, D3, and D4. In the example shown in FIG. 2, the segmented detector 24 has the four detection elements D1-D4 formed by angularly (circumferentially) dividing the toric detection surface 25 into four equal parts. Each of the detection elements D1-D4 can detect the electron beam independently.

No restriction is imposed on the number of detection elements of the detection surface 25. The segmented detector 24 may also have plural detection elements formed by dividing the detection surface 25 radially and circumferentially in a manner not illustrated. For example, in the segmented detector 24, the detection surface 25 may have 16 detection elements by dividing the detection surface 25 into four parts radially and into four parts circumferentially.

The segmented detector 24 is configured, for example, including an electron-light converter (scintillator) for converting an electron beam into light, the converter being divided into the plural detection elements D1, D2, D3, and D4, light transfer paths (bundle of optical fibers) for transferring streams of the light from the detection elements D1-D4, and plural light detectors (photomultipliers) for converting the streams of light for the detection elements D1-D4 from the light transfer paths into electrical signals. The segmented detector 24 sends output signals corresponding to the intensities of the electron beam detected respectively by the detection elements D1-D4 to the processing section 40.

The control unit 30 controls the various component parts (such as the optical systems and sample stage 16) of the electron microscope 100. The control unit 30 controls the component parts of the microscope 100, for example, on the basis of control signals from a control unit 42.

The manual control unit 50 obtains a control signal responsive to a user's operation or manipulation and sends the signal to the processing section 40. For example, the manual control unit 50 is made of buttons, keys, a touch panel display, a microphone, or the like.

The display device 52 operates to display the image generated by the processing section 40. The function of the display device 52 can be implemented by an LCD, a CRT, or the like. The display device 52 displays the image generated by an image generator 44, for example.

The storage device 54 operates as a working area for the processing section 40. The function of the storage device 54 can be implemented by a RAM or the like. The storage device 54 stores programs, data, and related information permitting the processing section 40 to perform various control operations and calculational operations. The storage device 54 is also used to temporarily store the results of calculations executed by the processing section 40 in accordance with various programs.

The processing section 40 performs various control operations and calculational operations in accordance with programs stored in the storage device 54. The processing section 40 operates as the control unit 42 and image generator 44 described below by executing programs stored in the storage device 54. The functions of the processing section 40 can be implemented by running programs using various processors (such as CPU, DSP, and the like). At least a part of the functions of the processing section 40 may be realized by dedicated circuitry such as ASIC (e.g., gate arrays). The processing section 40 includes the control unit 42 and the image generator 44.

The control unit 42 performs processing to generate control signals for controlling the various component parts of the electron microscope 100. For example, the control unit 42 generates the control signals according to user's instruction given via the manual control unit 50 and sends the signals to the control unit 30.

The image generator 44 performs processing to generate a STEM image using the output signal from the segmented detector 24. The image generator 44 generates the STEM image (DPC method) by a differential phase contrast (DPC) method from the output signals of the segmented detector 24 which represent the results of detections made by the detection elements D1, D2, D3, and D4 of the detector 24. The DPC images are obtained by scanning the electron beam over the sample S and measuring the amount of deflection of the beam caused by the electromagnetic field in the sample S for each position of impingement of the beam. Details of the operation of the image generator 44 will be described later.

1.2. Method of Image Acquisition

Figure 3:
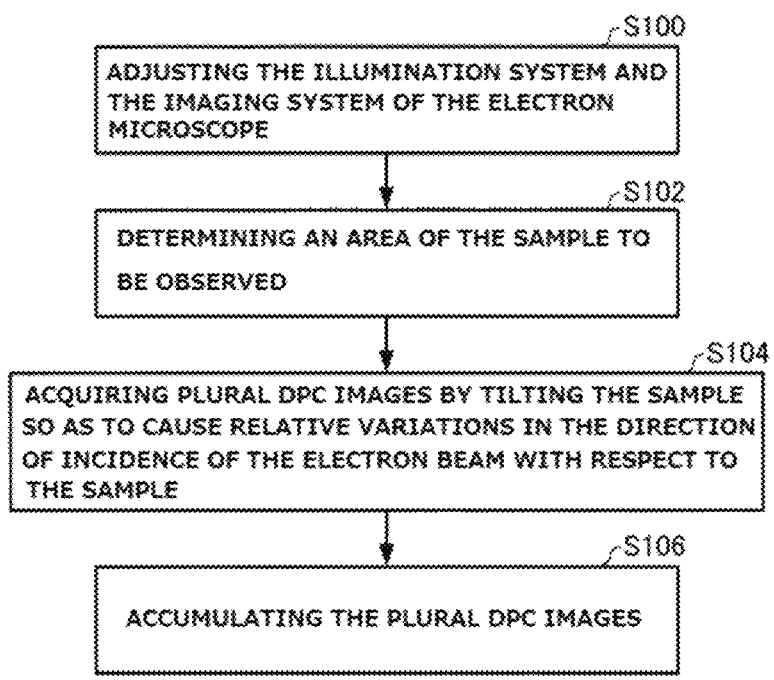
FIG. 3 is a flowchart illustrating one example of operational sequence of a method of image acquisition associated with the first embodiment.

A method of image acquisition associated with the first embodiment is next described by referring to the flowchart of FIG. 3, which illustrates one example of operational sequence of the method of image acquisition. An example in which a DPC image is obtained using the electron microscope 100 is given below.

(1) Adjustment of Illumination System and Imaging System (Step S100)

First, the illumination system and imaging system of the electron microscope 100 are adjusted. In particular, the final magnification, the camera length of the imaging system, and other parameters are set. Also, the optical systems are adjusted to prevent the position of the electron beam from moving over the detection surface 25 in spite of scanning of the beam over the sample S by the scan coils 13.

(2) Decision of Area of Sample to be Observed (Step S102)

Then, an area of the sample S to be observed is determined. The user manipulates the sample stage 16 to search the sample S for an area to be observed and places this area at the center of the field of view. At this time, it is assumed that the tilting conditions for the sample S are so set that the electron beam enters along low-order crystal zone axes.

(3) Acquisition of DPC Images (Step S104)

Plural DPC images are then acquired by tilting the sample S so as to cause relative variations in the direction of incidence of the electron beam with respect to the sample S.

In particular, the illumination system is first brought to focus on the area of the sample S to be observed. Then, an adjustment is made using the imaging deflector 22 such that the electron beam transmitted through the sample S is brought to the center of the detection surface 25 of the segmented detector 24.

Figure 4:
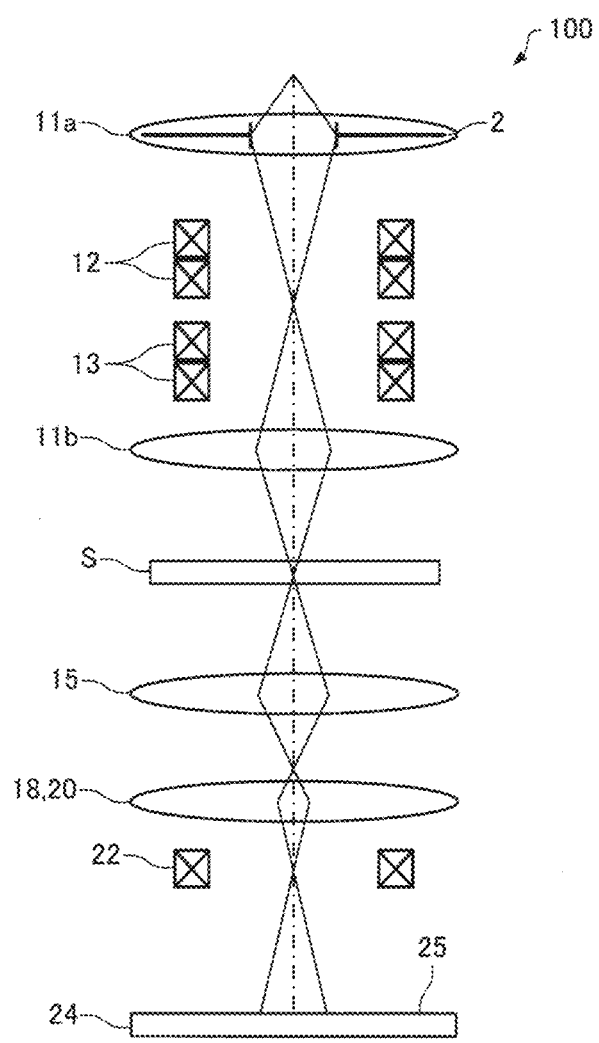
FIGS. 4 and 5 are electron ray diagrams illustrating the operation of the electron microscope of FIG. 1.
Figure 5:
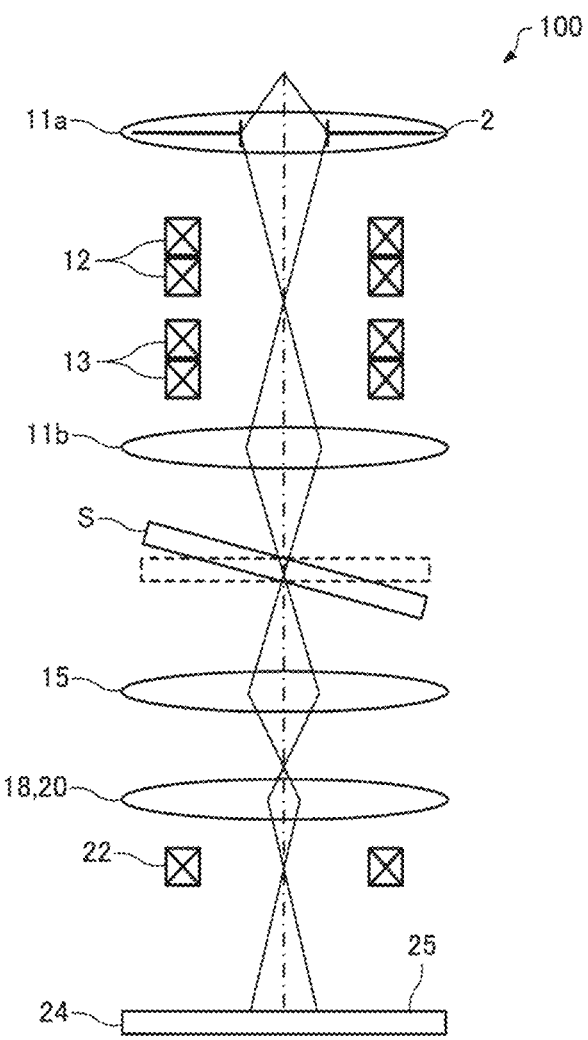

Then, DPC images are acquired. FIGS. 4 and 5 illustrate the operation of the electron microscope 100 when the DPI images are acquired. In the electron microscope 100, the electron beam emitted from the electron source 10 is focused onto the sample S by the condenser lens 11a and condenser minilens 11b of the illumination lens system 11 and scanned over the sample S by the scan coils 13. The electron beam transmitted through the sample S is transferred to the detection surface 25 of the segmented detector 24 by the objective minilens 15, intermediate lens 18, and projector lens 20. At this time, the optical systems of the microscope 100 are so adjusted that there is a conjugate relationship between the plane of the condenser aperture 2 of the illumination system and the plane of the detection surface 25.

The processing section 40 accepts the output signal from the segmented detector 24. The image generator 44 acquires intensity information about the electron beam (information about the amount of signal) on the basis of the accepted output signal from the segmented detector 24 for each of the detection elements D1-D4. The image generator 44 computes the direction and magnitude of the shift of the electron beam on the detection surface 25 on the basis of the intensity information about the electron beam derived for each of the detection elements D1-D4. The direction and magnitude of the shift of the electron beam correspond to the sense and magnitude of the electromagnetic field within the sample S. Therefore, the image generator 44 computes the direction and magnitude of the shift of the electron beam on the basis of the output signal from the segmented detector 24 for each area hit by the electron beam, thus generating DPC images.

For example, the image generator 44 generates DPC images by making the magnitude of the electromagnetic field within the sample S correspond to contrast such that a distribution of the electromagnetic field within the sample S is imaged. Alternatively, the image generator 44 may image a distribution of the electromagnetic field within the sample S and generate DPC images by representing the senses of the electromagnetic field components within the sample S in colors and indicating the intensities of the electromagnetic field components in the sample S by gray-scale levels. In this way, DPC images can be acquired.

In the above description, images are taken while deenergizing the objective lens 14 in order to reduce the effects of the magnetic field produced by the objective lens 14. Such images may also be taken when the objective lens 14 is in an energized state. Also, in this case, DPC images can be acquired in the same manner as in the above example.

Then, the sample S is tilted using the tilt mechanism of the sample stage 16 as shown in FIG. 5. Consequently, the incident direction of the electron beam with respect to the sample S is varied. Under this condition, DPC images are acquired under the same conditions except that the tilt angle of the sample S is different. When the sample S is tilted using the tilt mechanism of the sample stage 16, if the field of view moves, the sample stage 16 is manipulated to return the field of view to its original position and then DPC images are acquired. The user carries out the tilting of the sample S, for example, by operating the tilting mechanism of the sample stage 16 via the manual control unit 50.

The process step of acquiring a DPC image is repeatedly performed whenever the sample S is tilted further and thus plural DPC images for each which the direction of incidence of the electron beam with respect to the sample S is different can be obtained.

Figure 6:
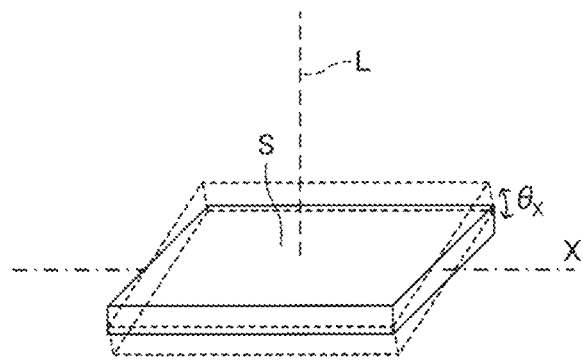
FIGS. 6 and 7 are perspective views schematically illustrating the manner in which a sample is being tilted using a tilt mechanism of a sample stage.
Figure 7:
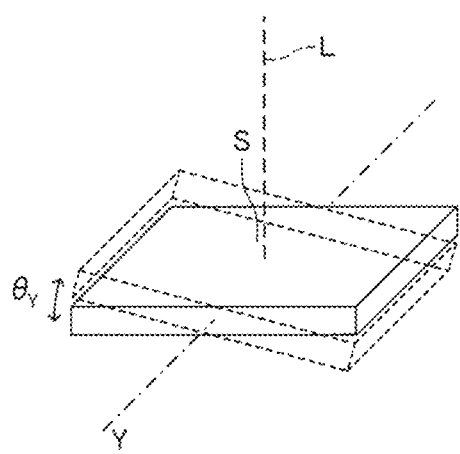

FIGS. 6 and 7 schematically illustrate the manner in which the sample S is tilted using the tilt mechanism of the sample stage 16. This tilt mechanism of the stage 16 can tilt the sample S about two axes (X and Y axes) perpendicular to each other as shown in FIGS. 6 and 7. Therefore, in the present step, the tilt angle $\theta_X$ of the sample S about the X axis and the tilt angle $\theta_Y$ of the sample S about the Y axis are tilted in given angular increments. Whenever the sample is tilted further, a DPC image is acquired. The X and Y axes are perpendicular to the optical axis L of the illumination system. The electron beam enters the sample S along the optical axis L.

For example, where the tilt angles $\theta_X$ and $\theta_Y$ are varied in increments of 1° within a range of from −1° to +1°, there are 9 combinations of the tilt angles $\theta_X$ and $\theta_Y$, i.e., $(\theta_X, \theta_Y)$= (−1, −1), (−1, 0), (−1, +1), (0, −1), (0, 0), (0, +1), (+1, −1), (+1, 0), and (+1, +1). Therefore, if the tilt angles $\theta_X$ and $\theta_Y$ are varied in increments of 1° within a range of from −1° to +1°, then it is possible to obtain 9 DPC images for each of which the direction of incidence of the electron beam with respect to the sample S is different.

No restrictions are placed either on the range of the tilt angles $\theta_X$ and $\theta_Y$ or on their angular increments. In order to reduce the effects of diffraction contrast further, it is desirable to increase the number of acquired DPC images by tilting the sample S at more tilt angles, i.e., the electron beam is made to impinge on the sample S from more diverse incident directions.

(4) Accumulation of DPC Images (Step S106)

Then, one image (DPC image) is produced by accumulating the plural DPC images for each of which the incident direction of the electron beam relative to the sample S is different. Before the accumulation process, the DPC images may be aligned among one another and the deviations of the field of view among the images can be corrected. Furthermore, after accumulating the plural DPC images, averaging may be performed.

An image obtained by accumulating plural DPC images, for each of which the direction of incidence of the electron beam with respect to the sample S is different, is less affected by diffraction contrast such as fringes of equal thickness and fringes of equal inclination than a DPC image for which there is only one direction of incidence of the electron beam with respect to the sample S, for the following reason. Contrast produced by a DPC method is not or little affected by the incident direction of the electron beam relative to the sample S. In contrast, diffraction contrast such as fringes of equal thickness and fringes of equal inclination varies sensitively depending on the direction of incidence of the electron beam with respect to the sample S. As a result of the steps described thus far, DPC images in which diffraction contrast has been reduced can be obtained.

The method of image acquisition associated with the present embodiment has the following features. This method of image acquisition involves the steps of: obtaining plural DPC images by causing relative variations in the direction of incidence of the electron beam with respect to the sample S; and accumulating the DPC images to thereby produce an image. Therefore, in the method of image acquisition associated with the present embodiment, it is possible to generate DPS images in which the effects of diffraction contrast such as fringes of equal thickness and fringes of equal inclination have been reduced. Furthermore, according to the method of image acquisition associated with the present embodiment, the effects of diffraction contrast can be reduced without lessening contrast produced by a DPC method.

Furthermore, according to the method of image acquisition associated with the present embodiment, DPC images less affected by diffraction contrast can be easily obtained without the need for a user to search on a trial and error basis for sample tilting conditions under which diffraction contrast is decreased.

In addition, according to the method of image acquisition associated with the present embodiment, DPC images can be observed from any arbitrary orientation. Accordingly, the relationship between a distribution of the electromagnetic field within the sample S and crystallographic orientations can be clarified, for example.

Further, according to the method of image acquisition associated with the present embodiment, when a polycrystal is observed, the effects of diffraction contrast can be reduced for all of the crystallites within the field of view.

Figure 8:
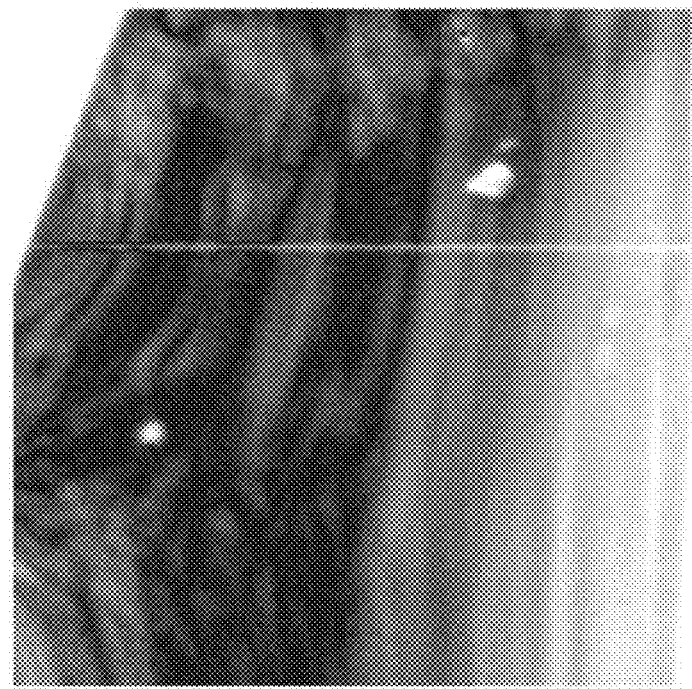
FIG. 8 shows an image obtained by accumulating 64 DPC (differential phase contrast) images generated in turn by tilting the sample at tilt angles $\theta_X$ and $\theta_Y$ which are varied in increments of 0.3° within a range of from −1° to +1°.
Figure 9:
FIG. 9 shows a DPC image obtained by bringing the direction of incidence of the electron beam with respect to the sample into the vicinity of crystal zone axes.

FIG. 8 shows an image obtained by accumulating 64 DPC images while tilting the sample at the tilt angles $\theta_X$ and $\theta_Y$ that vary in increments of 0.3° within a range of from −1° to +1°. FIG. 9 shows a comparative example of DPC image in which the direction of incidence of the electron beam with respect to the sample was brought close to crystal zone axes.

In the DPC image shown in FIG. 9, the incident direction of the electron beam relative to the sample is close to crystal zone axes and so the effects of diffraction contrast are pronounced. Therefore, it is difficult to make a distinction between the contrast of the PN junction produced by visualizing the electric field across the PN junction by a DPC method and diffraction contrast. Hence, the contrast across the PN junction is not easily discernible. In contrast, in the DPC method shown in FIG. 8, the effects of diffraction contrast are reduced and thus a linear contrast of interest across the PN junction can be clearly discerned. This result indicates that the present embodiment makes it possible to reduce the effects of diffraction contrast without spoiling the contrast attributed to the electric field across the PN junction and produced by a DPC method.

In the above description, a DPC image less affected by diffraction contrast is acquired by obtaining plural DPC images while causing relative variations in the direction of incidence of the electron beam with respect to the sample S and accumulating the DPC images. The method of image acquisition associated with the present embodiment is applicable to other types of electron microscope images, as well as to DPC images.

The method of image acquisition associated with the present embodiment is also applicable to bright-field STEM images, for example. A bright-field STEM image is obtained by detecting those electrons of an electron beam transmitted through the sample S which are not scattered or scattered at less than a given angle by a bright-field STEM detector. Where the method of image acquisition associated with the present embodiment is applied to bright-field STEM images, bright-field STEM images less affected by diffraction contrast can be generated in the same way as in the case of DPC images. That is, plural bright-field STEM images are obtained while causing relative variations in the direction of incidence of the electron beam with respect to the sample S, and the bright-field STEM images are accumulated.

Additionally, the method of image acquisition is especially effective in observing a sample in which contrast of a portion of interest does not vary in sensitive response to minute variations in the thickness or tilt of the sample as encountered where a morphological observation of deposits in a bulk sample is made or dislocation cores in a crystal and their vicinities are observed.

1.3. Operation of Electron Microscope

The operation of the electron microscope 100 associated with the first embodiment is next described. In the microscope 100, the processing section 40 performs processing of the above-described step S104 and a step S106 as described below.

Figure 10:
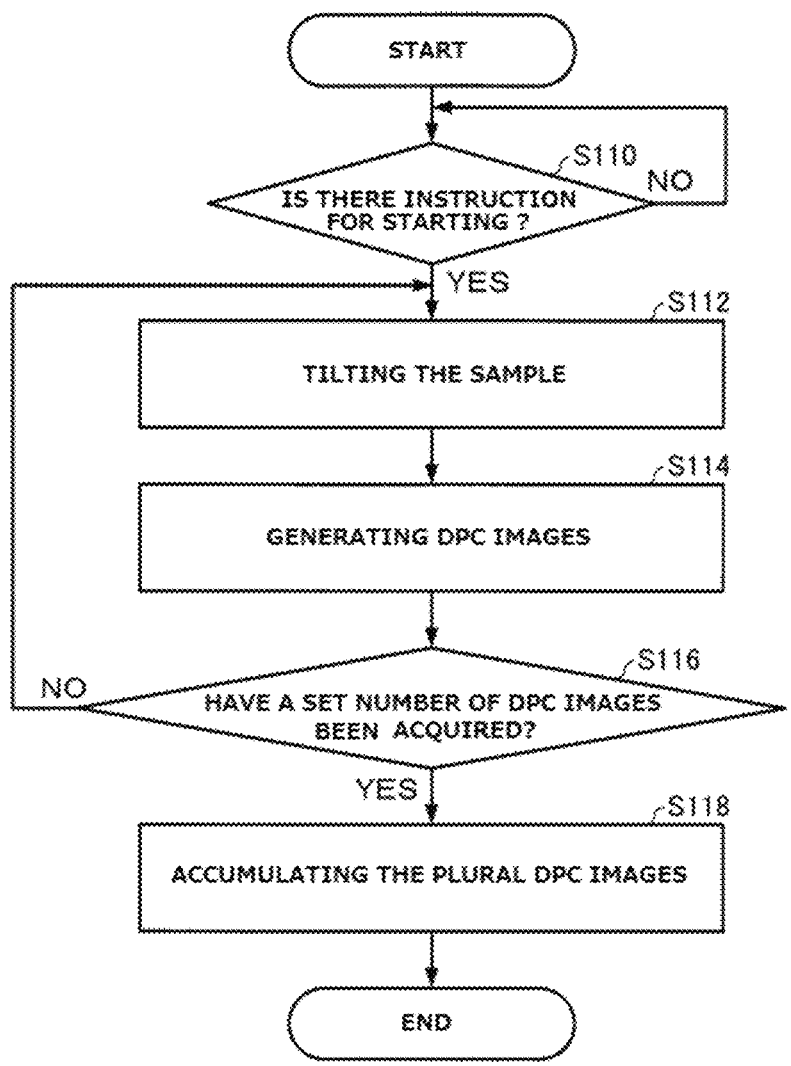
FIG. 10 is a flowchart illustrating one example of operational sequence of the processing section of the electron microscope of FIG. 1.

FIG. 10 is a flowchart illustrating one example of operational sequence of the processing section 40 of the electron microscope 100 associated with the first embodiment.

First, the processing section 40 makes a decision as to whether the user has issued an instruction for starting acquisition of images (step S110). The processing section 40 determines that the user has issued an instruction for starting acquisition of images, for example, if a manipulation for the starting is performed with the image acquisition start button, keyboard, a GUI, or the like.

If the decision at step S110 is affirmative (YES), indicating that an instruction for starting acquisition of images has been issued, the control unit 42 controls the tilt mechanism of the sample stage 16 such that the sample S assumes a set tilt angle (step S112). For example, information for setting the range of the tilt angles $\theta_X$ and $\theta_Y$ of the sample S and the angular increments of the tilt angles is previously stored in the storage device 54. The control unit 42 reads out these pieces of information and sets the tilt angles.

Then, the control unit 42 controls the scan coils 13 such that the electron beam is scanned over the sample S. The processing section 40 accepts the output signal from the segmented detector 24. The image generator 44 generates DPC images on the basis of the output signal from the segmented detector 24 (step S114).

The processing section 40 then makes a decision as to whether a set number of DPC images have been acquired (step S116). The number of acquired DPC images is determined from the information for setting the tilt angle such as the range of the tilt angles $\theta_X$ and $\theta_Y$ of the sample S and their angular increments.

If the decision at step S116 is negative (NO), indicating that the set number of DPC images are not yet acquired, control returns to step S112, where the sample S is tilted. Also, step S114 for acquiring DPC images is performed. In the step of tilting the sample S, a new tilt angle is set based on information for setting the tilt angle, the information being stored in the storage device 54. The processing sequence of steps S112, S114, and S116 is repeated until the set number of DPC images are acquired.

If the decision at step S116 is YES, indicating that the set number of DPC images have been acquired, the image generator 44 accumulates the acquired DPC images for each of which the direction of incidence of the electron beam with respect to the sample S is different, thus producing one DPC image (step S118). The processing section 40 then displays the produced image on the display device 52 and ends the present processing subroutine.

The electron microscope 100 has the following features. In the electron microscope 100, the image generator 44 operates to obtain plural DPC images by causing relative variations in the direction of incidence of the electron beam with respect to the sample S by the sample stage 16 and to accumulate the plural DPC images for generating an image. Therefore, according to the electron microscope 100, DPC images in which the effects of diffraction contrast such as fringes of equal thickness and fringes of equal inclination have been reduced can be produced easily.

2. Second Embodiment

2.1. Electron Microscope

The electron microscope associated with the second embodiment is identical in configuration with the electron microscope 100 shown in FIG. 1 and so a description and illustration thereof is omitted.

2.2. Method of Image Acquisition

In the method of image acquisition associated with the above-described first embodiment, the causing of the relative variations in the direction of incidence of the electron beam with respect to the sample S is carried out by tilting the sample S relative to the direction of incidence of the beam.

On the other hand, in the method of image acquisition associated with the second embodiment, the causing of the relative variations in the direction of incidence of the electron beam with respect to the sample S is carried out by deflecting the electron beam impinging on the sample S so as to vary the direction of incidence of the elecron beam with respect to the sample S.

More specifically, in the first embodiment, the sample stage 16 having the tilt mechanism functions as an incident direction control section for providing relative control of the direction of incidence of the electron beam with respect to the sample S. In the present embodiment, the illumination deflector system 12 operates as an incident direction control section. Only the differences with the above-described method of image acquisition associated with the first embodiment are described below; a description of similarities is omitted.

Figure 11:
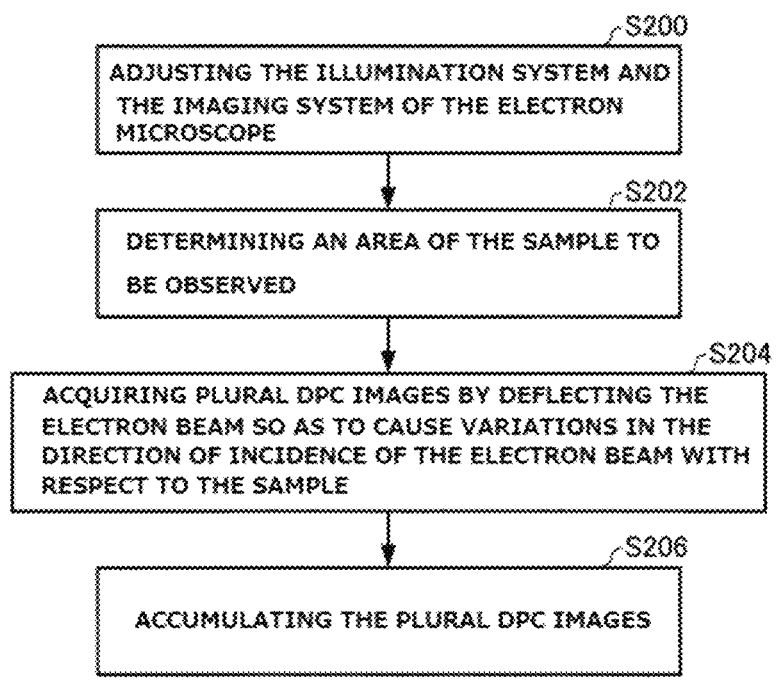
FIG. 11 is a flowchart illustrating one example of method of image acquisition associated with a second embodiment.

FIG. 11 is a flowchart illustrating one example of operational sequence of the method of image acquisition associated with the second embodiment.

(1) Adjustments of Illumination System and Imaging System (Step S200)

First, the illumination system and imaging system of the electron microscope 100 are adjusted. In the present step, the adjustment described in the above-described step S100 is made. In addition, an adjustment is made to correct deviation of the electron beam impinging on the detection surface 25 of the segmented detector 24 caused by deflection of the electron beam using the illumination deflector system 12.

Specifically, the electron beam is first deflected by a given amount with the illumination deflector system 12. At this time, the position on the detection surface 25 hit by the electron beam makes a motion according to the amount of deflection of the beam made by the illumination deflector system 12 and, therefore, the beam is made to swing back an amount equal to this motion by the imaging deflector 22 and the hit position is brought to the center of the detection surface 25. The settings (centering conditions) of the illumination deflector system 12 and of the imaging deflector 22 made at this time are recorded. This step is performed repeatedly while varying the amount of deflection of the electron beam caused by the illumination deflector system 12.

(2) Decision of Area of Sample to be Observed (Step S202)

Then, an area of the sample S to be observed is determined. The present step (step S202) is performed similarly to the above-described step S102.

(3) Acquisition of DPC Images (Step S204)

Then, the direction of incidence of the electron beam with respect to the sample S is varied by deflecting the electron beam using the illumination deflector system 12, and plural DPC images are acquired.

In particular, the illumination system is brought to focus on the area of the sample S to be observed. The illumination deflector system 12 is set such that the electron beam enters along low-order crystal zone axes of the sample S.

Then, DPC images are acquired in the same way as in the above-described step S104.

Then, the direction of incidence of the electron beam with respect to the sample S is varied using the illumination deflector system 12. Under this condition, the DPC images are acquired under the same conditions except that the direction of incidence of the beam is different. Variation of the direction of incidence of the electron beam is carried out by the user, for example, by operating the illumination deflector system 12 via the manual control unit 50.

When the electron beam is deflected using the illumination deflector system 12, the deflector system 22 is operated based on the centering conditions recorded at step S200. Consequently, it is possible to correct positional deviation of the electron beam on the detection surface 25 due to the deflection of the beam caused by the illumination deflector system 12.

The step of acquiring a DPC image is performed repeatedly whenever the direction of incidence of the electron beam is varied by deflecting the beam. Thus, plural DPC images for each of which the direction of incidence of the electron beam with respect to the sample S is different can be acquired.

Figure 12:
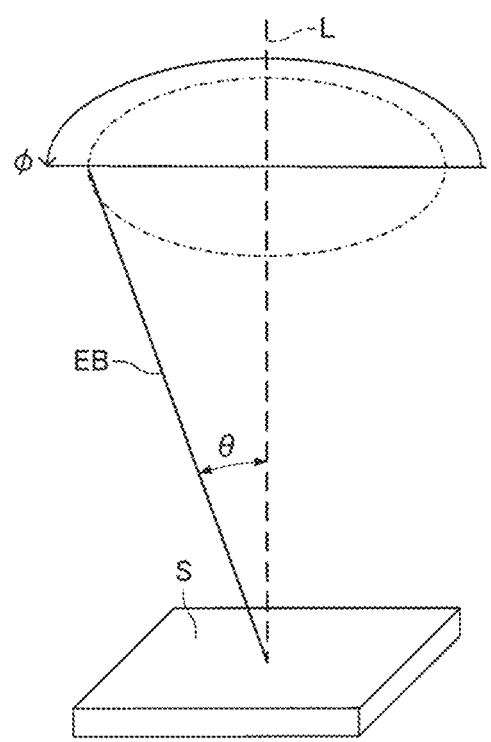
FIGS. 12 and 13 are perspective views schematically illustrating the manner in which the direction of incidence of the electron beam with respect to the sample is being varied by deflecting the beam by the use of an illumination deflector system.
Figure 13:
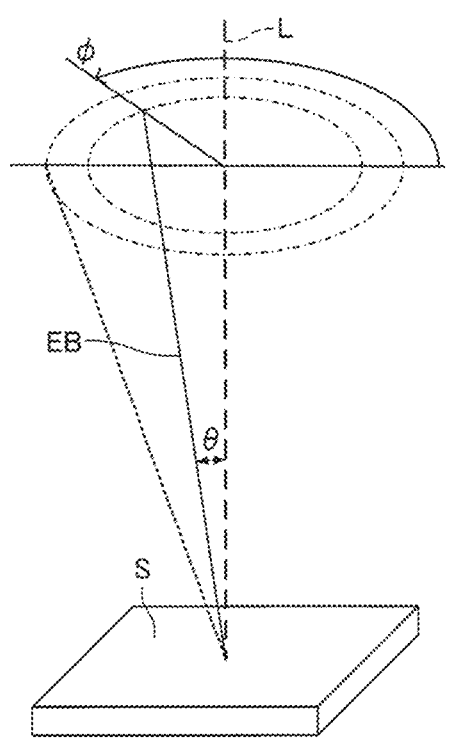

FIGS. 12 and 13 schematically illustrate the manner in which the electron beam is deflected using the illumination deflector system 12 to vary the direction of incidence of the electron beam with respect to the sample S. The direction of incidence of the electron beam with respect to the sample S is determined by the incident angle $\theta$ and the azimuthal angle $\Phi$ of the electron beam as shown in FIGS. 12 and 13. Therefore, in the present step, the incident angle $\theta$ and the azimuthal angle $\Phi$ of the electron beam are varied in given angular increments.

No restrictions are placed either on the range of the incident angle $\theta$ and azimuthal angle $\Phi$ or on the angular increments. In order to reduce the effects of diffraction contrast further, it is desired to increase the number of acquired DPC images by making the electron beam enter from more incident directions.

(4) Accumulation of DPC Images (Step S204)

Then, the plural DPC images for each of which the incident direction of the electron beam with respect to the sample S is different are accumulated to create one DPC image. The present step (step S204) is performed similarly to the above-described step S104. Because of the processing sequence described thus far, a DPC image in which diffraction contrast has been lessened can be obtained. The method of image acquisition associated with the present embodiment can yield advantageous effects similar to those produced by the above-described method of image acquisition associated with the first embodiment.

2.3. Operation of Electron Microscope

The operation of the electron microscope associated with the second embodiment is next described. In the electron microscope associated with the second embodiment, the processing section 40 performs the processing of the above-described steps S204 and S206 as described below.

Figure 14:
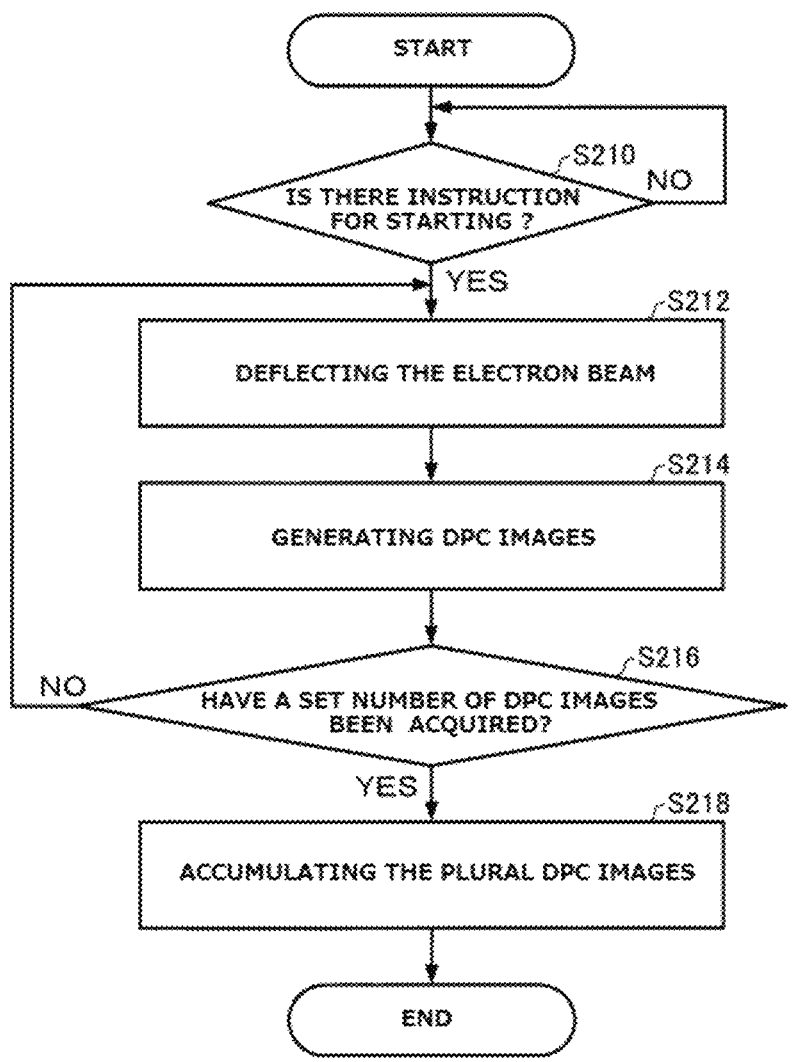
FIG. 14 is a flowchart illustrating one example of operational sequence of the processing section of the electron microscope associated with the second embodiment.

FIG. 14 is a flowchart illustrating one example of operational sequence of the processing section 40 of the electron microscope associated with the second embodiment. First, the processing section 40 makes a decision as to whether the user has issued an instruction for starting acquisition of images (step S210). The present step S210 is performed similarly to the above-described step S110.

If the decision at step S210 is YES, indicating that an instruction for starting acquisition of images has been issued, the control unit 42 controls the illumination deflector system 12 such that the direction of incidence of the electron beam with respect to the sample S agrees with the set incident direction (step S212). For example, information about the range of the incident angle θ and the azimuthal angle Φ and the angular increments for setting the direction of incidence of the electron beam is previously stored in the storage device 54. The control unit 42 reads out these pieces of information and sets the incident direction of the beam.

The control unit 42 then controls the scan coils 13 such that the electron beam is scanned over the sample S. The processing section 40 accepts the output signal from the segmented detector 24. The image generator 44 generates a DPC image on the basis of the output signal from the segmented detector 24 (step S214).

The processing section 40 then makes a decision as to whether a set number of STEM images have been acquired (step S216). The present step S216 is performed similarly to the above-described step S116.

If the decision at step S216 is NO, indicating that the set number of STEM images have not been yet acquired, control goes back to step S212, and the processing of steps 212 and S214 is performed. In the step S212 for deflecting the electron beam, a new incident direction of the electron beam is set based on the information stored in the storage device 54 for setting the incident direction of the electron beam. The processing of steps S212, S214, and S216 is performed repeatedly until the set number of STEM images are acquired.

If the decision at step S216 is YES, indicating that the set number of STEM images have been acquired, the image generator 44 accumulates plural STEM images for each of which the direction of incidence of the electron beam with respect to the sample S is different to generate one DPC image (step S218). Then, the processing section 40 displays the generated image on the display device 52 and ends the processing subroutine. The electron microscope associated with the present embodiment can yield advantageous effects similar to those produced by the above-described electron microscope 100 associated with the first embodiment.

3. Third Embodiment

3.1. Electron Microscope

The electron microscope associated with the third embodiment is identical in configuration with the electron microscope 100 shown in FIG. 1 and so a description and illustration thereof is omitted.

3.2. Method of Image Acquisition

In the above-described methods of image acquisition associated with the first and second embodiments, a DPC image less affected by diffraction contrast is acquired by obtaining plural DPC images while causing relative variations in the direction of incidence of the electron beam with respect to the sample S and accumulating the obtained DPC images.

In contrast, in the method of image acquisition associated with the third embodiment, a DPC image less affected by diffraction contrast is acquired by scanning the electron beam over the sample S while varying the direction of incidence of the electron beam with respect to the sample S at each position of impingement, obtaining intensity information about the electron beam transmitted through the sample S at each position of impingement, and generates an image on the basis of the intensity information. Only the differences with the methods of image acquisition associated with the above-described first and second embodiments are described below; a description of similarities is omitted.

Figure 15:
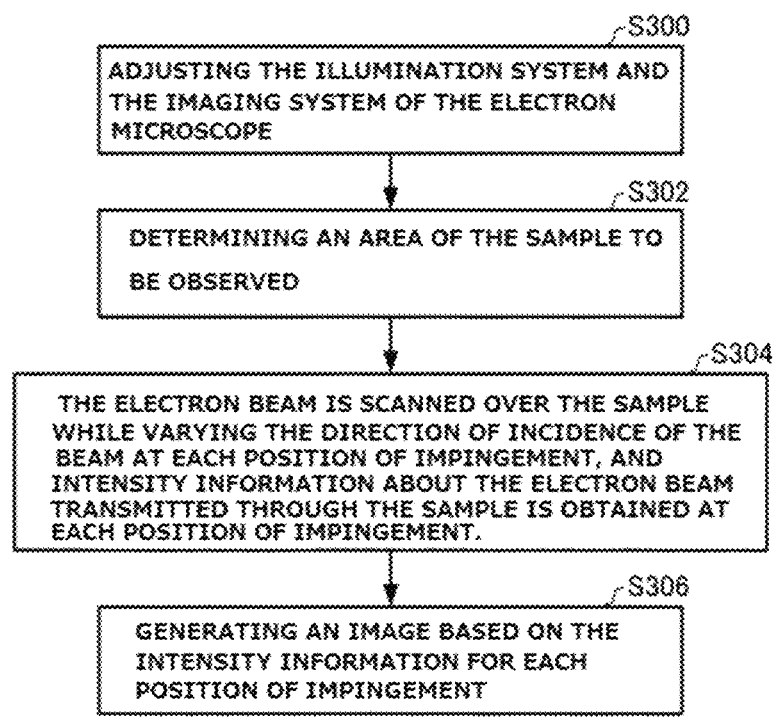
FIG. 15 is a flowchart illustrating one example of image acquisition method associated with a third embodiment.

FIG. 15 is a flowchart illustrating one example of image acquisition method associated with the third embodiment.

(1) Adjustments of Illumination System and Imaging System (Step S300)

First, the illumination system and imaging system of the electron microscope 100 are adjusted. The present step (step S300) is performed similarly to the above-described step S100.

(2) Decision of Area of Sample to be Observed (Step S302)

Then, an area of the sample S to be observed is determined. The present step (step S302) is performed similarly to the above-described step S102.

(3) Acquisition of Intensity Information about Electron Beam at Each Position of Illumination (Step S304)

Then, the electron beam is scanned over the sample while varying the direction of incidence of the beam at each position of impingement, and intensity information about the electron beam transmitted through the sample S is obtained at each position of impingement. That is, in the present step, the electron beam is scanned over the sample S while rocking the beam at each position of impingement assumed during scanning of the beam over the sample S.

Figure 16:
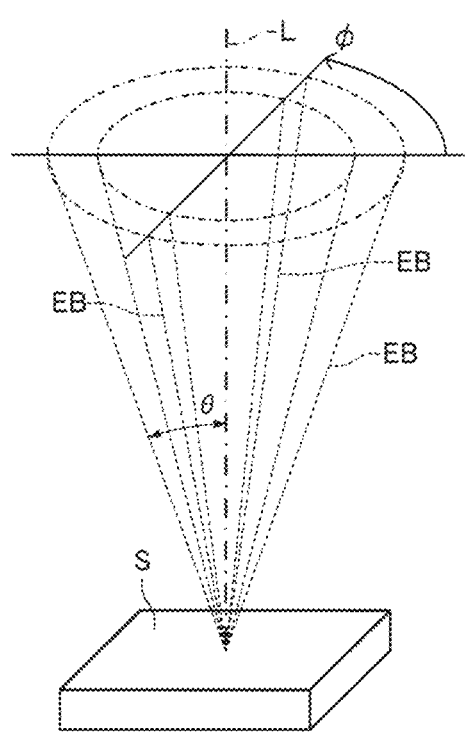
FIG. 16 is a perspective view illustrating the manner in which the electron beam is rocked.

FIG. 16 illustrates the rocking of the electron beam. That is, the direction of incidence of the electron beam EB (at least one of the incident angle θ and azimuthal angle Φ of the electron beam) is varied (i.e., scanned) while holding the position of impingement of the beam at one fixed point on the sample S as shown in FIG. 16.

In particular, in the present step, the electron beam emitted from the electron source 10 is rocked using the illumination deflector system 12 at the initial position of impingement. The electron beam transmitted through the sample S is detected by the segmented detector 24 and intensity information about the beam is obtained. The electron beam is made to enter from a plurality of preset incident directions.

Then, the electron beam emitted from the electron source 10 is moved into the next position of impingement using the scan coils 13. The beam is rocked at this next position of impingement using the illumination deflector system 12. The electron beam transmitted through the sample S is detected by the segmented detector 24 and intensity information about this beam is obtained. The beam is made to enter from a plurality of preset incident directions in the same way as for the first position of impingement. That is, the electron beam incident conditions at this next position are identical with the electron beam incident conditions at the first position of impingement. By repeating this process, the intensity information about the electron beam transmitted through the sample S can be obtained for each position of impingement.

In the present step, as shown in FIG. 16, the incident angle θ and the azimuthal angle Φ of the electron beam are varied in given angular increments. The conditions under which the direction of incidence of the electron beam is varied are identical for every position of impingement.

No restrictions are imposed either on the range of the incident angle θ and azimuthal angle Φ or on the angular increments. In order to reduce the effects of diffraction contrast further, it is preferable to increase the number of times that the incident direction is varied at each position of impingement.

Where the incident direction of the electron beam is varied by the illumination deflector system 12 as described above, the electron beam incident on the detection surface 25 of the segmented detector 24 causes a positional deviation. Therefore, the electron beam is swung back using the imaging deflector 22 according to the amount of deflection of the beam at the position of the illumination deflector system 12. Consequently, it is possible that the positional deviation of the electron beam on the detection surface 25 due to deflection of the beam will be corrected by the illumination deflector system 12.

(4) Generation of Images (Step S306)

A DPC image is generated based on the intensity information for each position of impingement. The DPC image is generated in the same way as in the above-described step S104.

A DPC image obtained in this way by scanning the electron beam while rocking it at each position of impingement is equivalent to a DPC image obtained by the method of image acquisition associated with the second embodiment. According to the present embodiment, it is possible to acquire DPC images less affected by diffraction contrast. Because of the process described thus far, DPC images less affected by diffraction contrast can be obtained. The method of image acquisition associated with the present embodiment can yield advantageous effects similar to those produced by the above-described methods of image acquisition associated with the first and second embodiments.

Furthermore, according to the image acquisition method associated with the present embodiment, DPC images in which diffraction contrast has been decreased can be obtained by scanning the electron beam over the sample S only once, unlike the image acquisition method associated with the second embodiment.

3.3. Operation of Electron Microscope

The operation of the electron microscope associated with the third embodiment is next described. In the electron microscope associated with the third embodiment, the processing section 40 performs the processing of the above-described steps S304 and S306 as described below.

Figure 17:
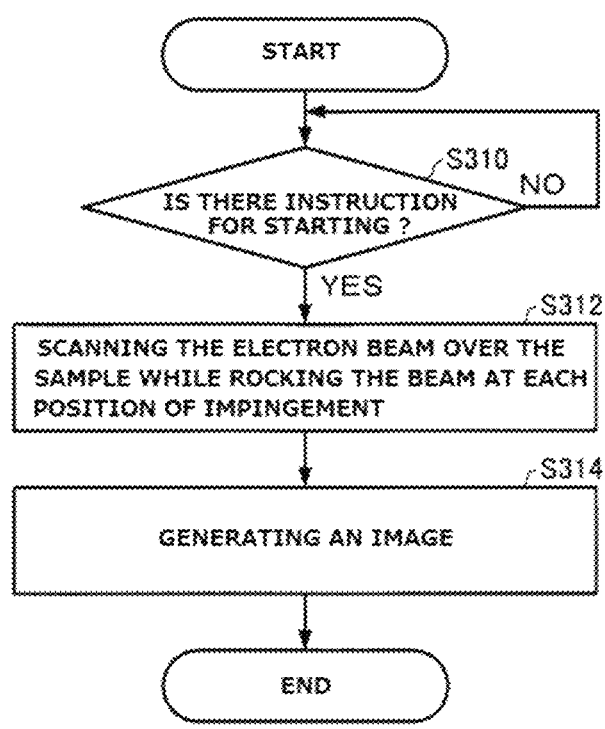
FIG. 17 is a flowchart illustrating one example of operational sequence of the processing section of an electron microscope associated with the third embodiment.

FIG. 17 is a flowchart illustrating one example of operational sequence of the processing section 40 of the electron microscope associated with the third embodiment. First, the processing section 40 makes a decision as to whether the user has issued an instruction for starting image acquisition (step S310). The present step (step S310) is performed similarly to the above-described step S110.

If the decision at step S310 is YES, indicating that an instruction for starting image acquisition has been issued, the control unit 42 controls the illumination deflector system 12 and the scan coils 13 to scan the electron beam over the sample S while varying the direction of incidence of the electron beam at each position of impingement (step S312). The image generator 44 generates a DPC image on the basis of the output signal from the segmented detector 24 (step S314). The processing section 40 displays the generated image on the display device 52 and ends the present processing subroutine.

The electron microscope associated with the present embodiment can yield advantageous effects similar to those produced by the electron microscope 100 associated with the first embodiment and the electron microscope associated with the second embodiment.

4. Fourth Embodiment 4.1. Electron Microscope

Figure 18:
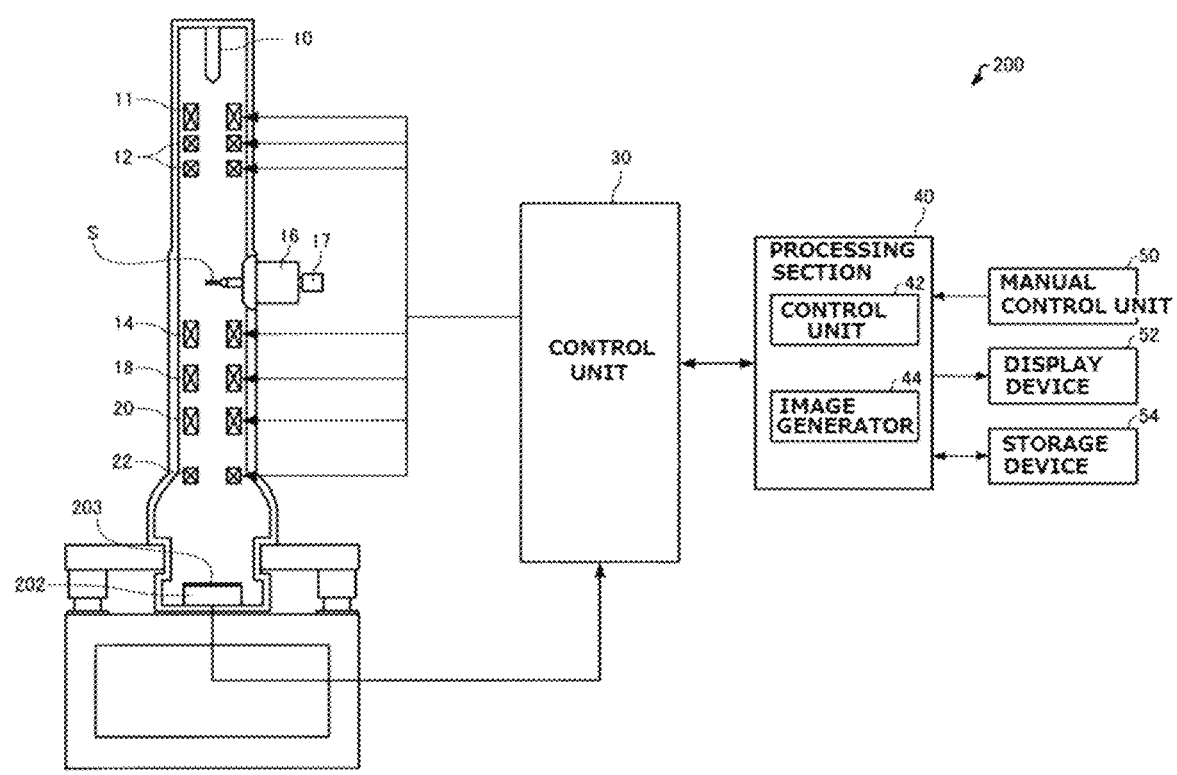
FIG. 18 is a schematic diagram similar to FIG. 1 but showing an electron microscope associated with a fourth embodiment.
Figure 19:
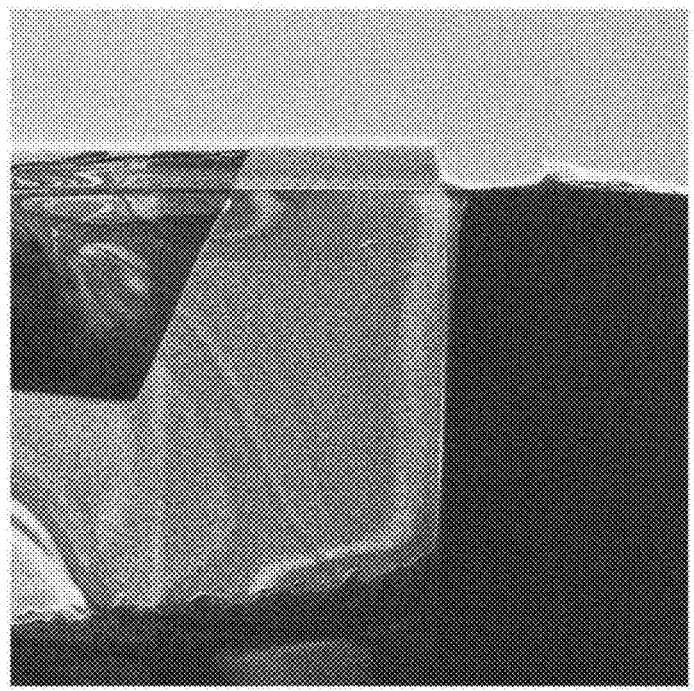
FIG. 19 is an azimuthal map of vector representing the result of an observation made of a PN junction in GaAs by a differential phase contrast method.

FIG. 18 schematically shows an electron microscope, 200, associated with a fourth embodiment. Those members of the electron microscope 200 associated with the fourth embodiment which are similar in function to their respective counterparts of the above-described electron microscope 100 associated with the first embodiment are indicated by the same reference numerals as in the above-referenced figures and a description thereof is omitted.

The above-described electron microscope 100 associated with the first embodiment is a scanning electron microscope. On the other hand, the electron microscope 200 associated with the fourth embodiment is a transmission electron microscope. That is, in the electron microscope 200, a transmission electron microscope (TEM) image can be obtained by directing an electron beam at the sample S and imaging the electron beam transmitted through the sample S.

The electron microscope 200 is equipped with an imager 202 which captures a TEM image focused by the imaging system. The imager 202 is a digital camera, for example, such as a CCD camera, CMOS camera, or the like.

In the electron microscope 200, the electron beam released from the electron source 10 is focused onto the sample S by the illumination lens system 11. The beam hitting the sample S is transmitted through the sample S and focused by the objective lens 14. The TEM image focused by the objective lens 14 is further magnified by the intermediate lens 18 and projector lens 20, projected onto the sensitive surface 203 of the imager 202, and captured by the imager 202.

4.2. Method of Image Acquisition

A case in which a DPC image less affected by diffraction contrast is acquired has been described regarding the above-described method of image acquisition associated with the first embodiment. In the method of image acquisition associated with the present embodiment, a TEM image in which diffraction contrast has been lowered can be obtained.

The method of image acquisition associated with the present embodiment is similar to the method of image acquisition associated with the first embodiment. That is, in the method of image acquisition associated with the present embodiment, plural TEM images are obtained while causing relative variations in the direction of incidence of the electron beam with respect to the sample S by tilting the sample S with the sample stage 16. The plural TEM images are accumulated to thereby produce an image. As a result, a TEM image in which diffraction contrast has been decreased can be obtained.

In particular, a TEM image is captured whenever the sample is tilted in a given angular increment by the tilt mechanism of the sample stage 16 in the same way as in the above-described step S104. Thus, there are acquired plural TEM images for each of which the direction of incidence of the electron beam with respect to the sample S is different. These TEM images are accumulated to thereby produce an image. Consequently, a TEM image in which the effects of diffraction contrast have been reduced can be obtained. According to the method of image acquisition associated with the present embodiment, TEM images less affected by diffraction contrast can be acquired.

4.3. Operation of Electron Microscope

The electron microscope 200 associated with the present embodiment is similar in operation to the electron microscope 100 except for the differences described in "4.2. Method of Image Acquisition" and so a description thereof is omitted.

According to the electron microscope 200 associated with the present embodiment, TEM images less affected by diffraction contrast can be obtained.

It is to be noted that the above-described embodiments and modifications are merely exemplary and that the invention is not restricted thereto. For example, the embodiments and modifications may be appropriately combined.

For example, in the method of image acquisition associated with the fourth embodiment, an example is given in which the method of image acquisition associated with the first embodiment is applied to TEM images. The method of image acquisition associated with the second embodiment can also be applied to TEM images. That is, plural TEM images are acquired by varying the direction of incidence of the electron beam with respect to the sample S by deflecting the beam with the illumination deflector system 12. The plural TEM images are accumulated to produce one image. Also in this case, TEM images less affected by the effects of diffraction contrast can be obtained.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

What is claimed is:

1. A method of image acquisition implemented in an electron microscope for generating a differential phase contrast (DPC) image with electrons transmitted through a sample, said method comprising the steps of:
    obtaining plural DPC images while causing relative variations in the direction of incidence of an electron beam with respect to the sample;
    generating one DPC image by accumulating the plural DPC images; and
    displaying the one generated DPC image.

2. The method of image acquisition as set forth in claim 1, wherein during said step of obtaining said plural DPC images, the causing of the relative variations in the direction of incidence of the electron beam with respect to the sample is carried out by tilting the sample relative to the direction of incidence of the electron beam.

3. The method of image acquisition as set forth in claim 1, wherein during said step of obtaining the plural DPC images, the causing of the relative variations in the direction of incidence of the electron beam with respect to the sample is carried out by deflecting the electron beam incident on the sample so as to vary the direction of incidence of the electron beam with respect to the sample.

4. The method of image acquisition as set forth in claim 1, wherein said plural DPC images are scanning transmission electron microscope images.

5. The method of image acquisition as set forth in claim 1, wherein said plural DPC images are transmission electron microscope images.

6. The method of image acquisition as set forth in claim 1, wherein each DPC image is an electron microscope image obtained by scanning the electron beam over the sample and measuring the amount of deflection of the electron beam caused by an electromagnetic field in the sample for each position of impingement of the electron beam.

7. A method of image acquisition implemented in an electron microscope for generating differential phase contrast (DPC) images by scanning an electron beam over a sample and obtaining intensity information about the electron beam transmitted through the sample for each position of impingement of the electron beam, said method comprising the steps of:
    obtaining the intensity information about the electron beam transmitted through the sample for each position of impingement by scanning the electron beam over the sample while varying the direction of incidence of the electron beam with respect to the sample at each position of impingement;
    generating one differential phase contrast (DPC) image on the basis of the intensity information about the electron beam for each position of impingement; and
    displaying the generated DPC image.

8. An electron microscope comprising:
    an electron source for emitting an electron beam;
    an incident direction control section for causing relative variations in the direction of incidence of the electron beam with respect to a sample;
    a detector for detecting the electron beam transmitted through the sample;
    an image generator for generating one differential phase contrast (DPC) image on the basis of the result of detection made by the detector, wherein said image generator operates to obtain plural DPC images derived by causing relative variations in the direction of incidence of the electron beam with respect to the sample by the use of the incident direction control section and to accumulate the plural DPC images, thus generating the one DPC image; and
    a display for displaying the one generated DPC image.

9. The electron microscope as set forth in claim 8, wherein said incident direction control section is a deflector that deflects the electron beam impinging on the sample.

10. The electron microscope as set forth in claim 8, wherein said incident direction control section is a sample stage equipped with a tilt mechanism for tilting the sample.

11. An electron microscope comprising:
an electron source for emitting an electron beam;
a scanning deflector for causing the electron beam emitted from the electron source to be scanned over a sample;
an incident direction control section for causing relative variations in the direction of incidence of the electron beam with respect to the sample;
a detector for detecting the electron beam transmitted through the sample;
an image generator for generating one differential phase contrast (DPC) image on the basis of the result of detection made by the detector, wherein said image generator operates to obtain intensity information about the electron beam transmitted through the sample for each position of impingement derived by scanning the electron beam over the sample by the scanning deflector while varying the direction of incidence of the electron beam with respect to the sample at each position of impingement by the incident direction control section and to generate the one DPC image on the basis of the intensity information about the electron beam for each position of impingement; and
a display for displaying the one generated DPC image.

* * * * *